United States Patent [19]
Mori

[11] Patent Number: 5,023,836
[45] Date of Patent: Jun. 11, 1991

[54] SEMICONDUCTOR MEMORY DEVICE
[75] Inventor: Toshihiko Mori, Isehara, Japan
[73] Assignee: Fujitsu Limited, Kawasaki, Japan
[21] Appl. No.: 381,768
[22] Filed: Jul. 18, 1989
[30] Foreign Application Priority Data Jul. 20, 1988 [JP] Japan ................................. 63-179156

[51] Int. Cl.⁵ ............................................. G11C 11/40
[52] U.S. Cl. .................................. 365/174; 365/159; 365/225.6
[58] Field of Search ................ 365/159, 174; 307/322, 307/461, 475, 225.6

[56] References Cited
U.S. PATENT DOCUMENTS 3,222,542 12/1965 Amodei ................................. 307/461

FOREIGN PATENT DOCUMENTS 0225698 6/1987 European Pat. Off. .
62-181468 8/1987 Japan .
63-23357 1/1988 Japan .
63-269394 11/1988 Japan .

OTHER PUBLICATIONS

N. Yokoyama et al, "A New Functional, Resonant-Tunneling Hot Electron Transistor (RHET)", pp. L853-L854, Japanese Journal of Applied Physics, vol. 24, No. 11, Nov., 1985.
N. Yokoyama et al, "Flip-Flop Circuit Using a Resonant-Tunneling Hot Electron Transistor (RHET)", pp. 1228-1229, Electronics Letters, vol. 22, No. 23, Nov. 6, 1986.
Chung-Yu Wu and Yih-Fang Liu, "A High-Density MOS Static RAM Cell Using the Lambda Bipolar Transistor," IEEE Journal of Solid-State Circuits, vol. SC-18, No. 2, Apr. 1983, pp. 222-224.

Primary Examiner—Terrell W. Fears
Attorney, Agent, or Firm—Staas & Halsey

[57] ABSTRACT

A semiconductor memory device comprises a transistor and a resistor. The transistor has negative differential resistance characteristics in an emitter current or a source current thereof. Therefore the semiconductor memory device has few elements and a simplified configuration, and thus high speed operation and large scale integration can be realized. Further, in the semiconductor memory device of the present invention, several variations in design are possible.

15 Claims, 18 Drawing Sheets

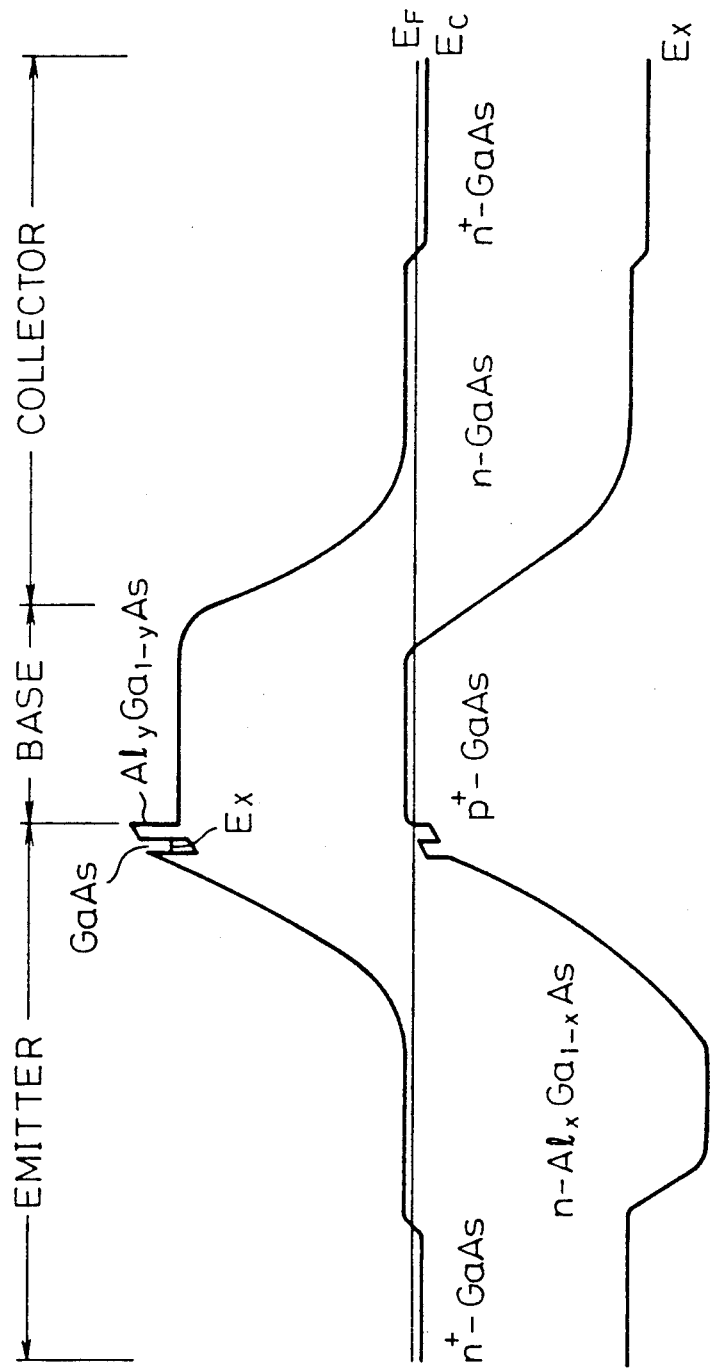

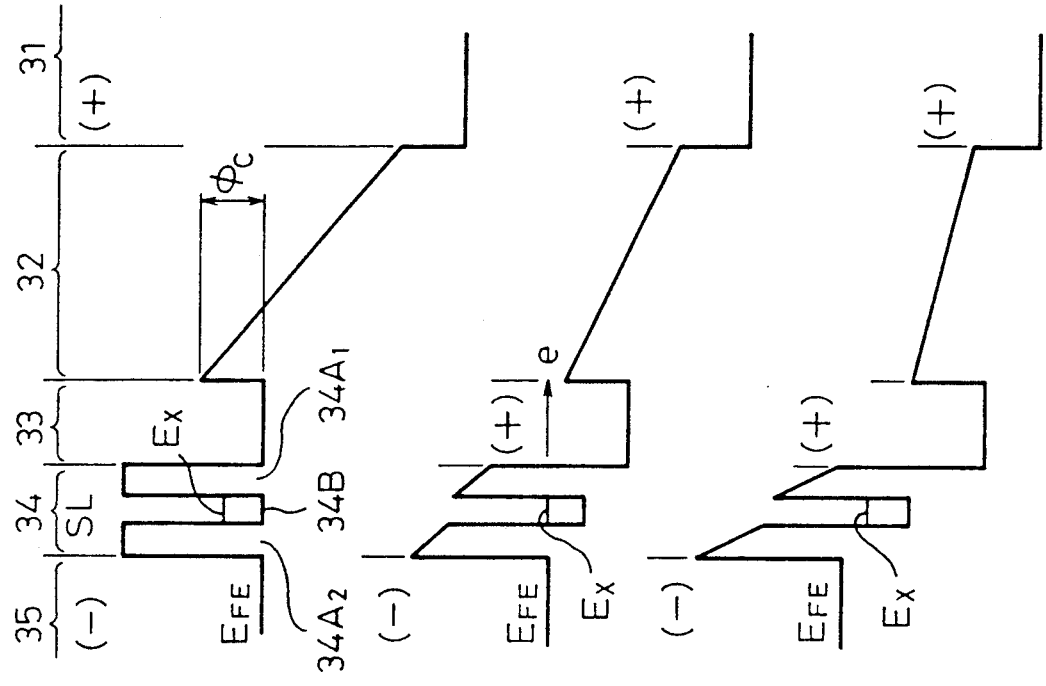

5,023,836

1

SEMICONDUCTOR MEMORY DEVICE

BACKGROUND OF THE INVENTION

1. Field of the Invention

The present invention relates to a semiconductor memory device, more particularly, to a semiconductor memory device using a transistor whose emitter current or source current has negative differential resistance characteristics. The transistor used for this semiconductor memory device is, for example, a Resonant-Tunneling Transistor (RTT), which has a resonant-tunneling barrier for injecting carriers.

2. Description of the Related Art

Recently, a Resonant-Tunneling Transistor (RTT) having a resonant-tunneling barrier for injecting carriers has been provided. This resonant-tunneling transistor includes a Resonant-Tunneling Hot-Electron Transistor (RHET) and a Resonant-Tunneling Bipolar Transistor (RBT) and the like, and has negative differential resistance characteristics in the emitter current of the transistor, and a high speed operation. Furthermore, an FET of the resonant-tunneling transistor type, which has a resonant-tunneling barrier for injecting carriers and negative differential characteristics in the source current of the FET, has been studied and developed in recent years. In these RTT elements, the emitter current (or the source current) relative to the base-emitter voltage (or a gate-source voltage) has N-shaped characteristics which increase, decrease, and then again increase. In addition to the above RTT elements, a Real Space Transition Transistor is known as a transistor having negative differential resistance characteristics in the source current thereof.

Incidentally, in accordance with the requirements of a high speed operation and a high integration, it is required that a configuration of a basic cell becomes simplified. Namely, for example, in a general static random access memory (SRAM), a flip-flop (basic cell) is constituted by a pair of crossconnected transistors, and a plurality of resistors or diodes, and one of two different operating states is selectively maintained. However, in this prior basic cell, a plurality of elements are required. For example, depending on the microscopic art of miniaturizing transistors and the like, it is difficult to satisfy the requirements of high speed operation and large scale integration in recent years. Therefore, a semiconductor memory device (for example, SRAM), which has fewer elements and selectively maintains one of two different operating states by using a more simplified basic cell, is required.

In order to satisfy the requirements of high speed operation and the large scale integration, a semiconductor memory device which uses an RTT having a resonant-tunneling barrier for injecting carriers, has been provided by the present applicant in Japanese Unexamined Patent Publication (Kokai) No. 63-269394 (Japanese Patent Application No. 62-103206). However, in the semiconductor memory device using the RTT of JPP '394, for example, a base current $I_B$ against a base-emitter voltage $V_{BE}$ should have negative differential resistance characteristics, a collector current $I_C$ should have characteristics of largely flowing after appearance of the negative differential resistance characteristics, and thus the RTT used for the above semiconductor memory device should be produced to purposely decrease its current gain. Therefore, a variation of the design of the RTT becomes small in size and a high speed operation of the RTT decreases. Furthermore, when the RTT is used for a logic element (for example, an exclusive NOR element), in the above semiconductor memory device, an RTT used for the logic element is not produced by the same production processes as used to produce the RTT used for the semiconductor memory device, since a collector current of the RTT used for the memory device should have negative differential resistance characteristics and a collector current $I_C$ of the RTT used for the logic element should flow after appearance of the negative differential resistance characteristics of a base current $I_B$ (which is described later in detail).

SUMMARY OF THE INVENTION

It is an object of the present invention to provide a semiconductor memory device having few elements and a simplified configuration and enabling a high speed operation and a large scale integration, and further having several possible variations in design.

According to the present invention, there is provided a semiconductor memory device comprising a first power supply unit, a second power supply unit, a transistor, and a resistor unit. The transistor has a first electrode, a second electrode and a third electrode, and has negative differential resistance characteristics. The first electrode of the transistor is connected to the first power supply unit, and the third electrode of the transistor is supplied with an input signal for selectively maintaining one of two different operating states of the transistor. A current flowing through the second electrode of the transistor has negative differential resistance characteristics relative to the voltage between the second electrode and the third electrode of the transistor. The resistor unit is connected between the second electrode of the transistor and the second power supply unit, and an output signal for indicating the maintained one state of the two different operating states of the transistor is brought out from a connection point between the second electrode of the transistor and the resistor unit.

Further, according to the present invention, there is also provided a semiconductor memory device comprising a first power supply unit, a second power supply unit, a transistor, a first resistor unit, and a second resistor unit. The transistor has a first electrode, a second electrode and a third electrode, and has negative differential resistance characteristics. The first electrode of the transistor is connected to the first power supply unit, and the third electrode of the transistor is supplied with an input signal for selectively maintaining one of two different operating states of the transistor. A current flowing through the second electrode of the transistor has negative differential resistance characteristics relative to the voltage between the second electrode and the third electrode of the transistor. The first resistor unit is connected between the second electrode of the transistor and the second power supply unit, and a first output signal for indicating the maintained one state of the two different operating states of the transistor is brought out from a connection point between the second electrode of the transistor and the resistor unit. The second resistor unit is connected between the first electrode of the transistor and the first power supply unit, and a second output signal of an inverted signal of the first output signal is brought out from a connection point between the first electrode of the transistor and the second resistor unit.

The transistor may comprise a resonant-tunneling transistor, and an emitter current or a source current of the resonant-tunneling transistor has negative differential resistance characteristics. The resonant-tunneling transistor may comprise a resonant-tunneling hot-electron transistor or a resonant-tunneling bipolar transistor. The resonant-tunneling transistor may comprise a GaAs/AlGaAs heterostructure or a GaInAs/(AlGa)InAs heterostructure. The resistor unit may be made of metal silicide or metal nitride produced by a sputtering method.

The semiconductor memory device may be used together with a logic element constituted by a resonant-tunneling transistor, and both resonant-tunneling transistors of the semiconductor memory device and the logic element have the same negative differential resistance characteristics. The semiconductor memory device may be used in a D-type flip-flop, the logic element may comprise an exclusive NOR element, and the D-type flip-flop and the exclusive NOR element may be used to constitute a random number generator device.

BRIEF DESCRIPTION OF THE DRAWINGS

The present invention will be more clearly understood from the description of the preferred embodiments as set forth below with reference to the accompanying drawings, wherein:

FIG. 3c is a view representing an energy state of a resonant-tunneling bipolar transistor made of GaAs/AlGaAs;

FIGS. 4a, 4b and 4c are graphs illustrating energy states of the resonant-tunneling hot-electron transistor shown in FIG. 3a;

FIG. 5 is a graph illustrating the characteristics of the resonant-tunneling hot-electron transistor shown in FIG. 3a;

DESCRIPTION OF THE PREFERRED EMBODIMENTS

For a better understanding of the preferred embodiments of the present invention, the problems of the related art will be explained first.

Figure 1:
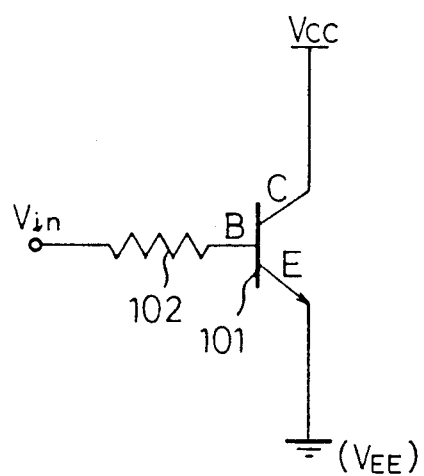
FIG. 1 is a circuit diagram of the principle elements of a semiconductor memory device according to the prior art.
Figure 2:
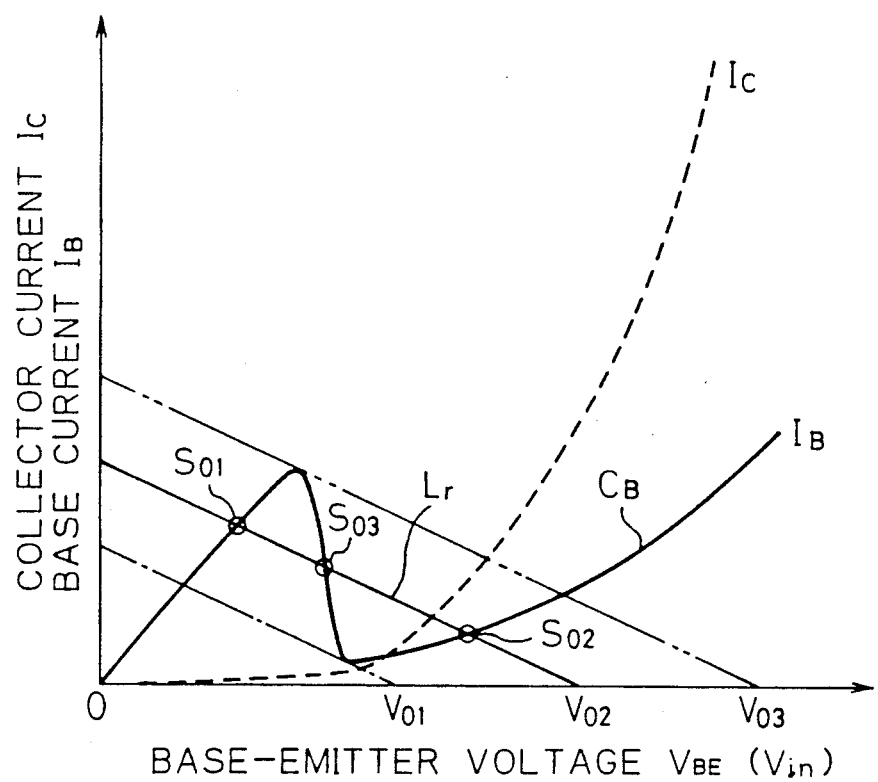
FIG. 2 is a diagram for explaining an operation of the semiconductor memory device shown in FIG. 1.

FIG. 1 is a circuit diagram for explaining the principle of a semiconductor memory device according to the prior art, and FIG. 2 is a diagram for explaining an operation of the semiconductor memory device shown in FIG. 1. This semiconductor memory device shown in FIG. 1 uses an RTT whose base current has negative differential resistance characteristics, and its base current primarily flows after appearance of the negative differential resistance characteristics of the RTT.

As shown in FIG. 1, in a prior semiconductor memory device, for example, a flip-flop used for a SRAM, a collector of an RTT 101 such as an RHET and the like is supplied with a power supply voltage $V_{CC}$, an emitter thereof is grounded (connected to a power supply $V_{EE}$), and a base thereof is connected to a resistor 102.

Note, in the RTT 101 used for the semiconductor memory device shown in FIG. 1, the base current $I_B$ relative to the base-emitter voltage $V_{BE}$ has an N-shaped negative differential resistance characteristic indicated by a solid line in FIG. 2, a collector current $I_C$ primarily flows after appearance of the negative differential resistance characteristics, and these characteristics of the collector current are indicated by a dash line in FIG. 2. It is obvious from FIG. 2, when the base-emitter voltage $V_{BE}$ (which is an input signal $V_{in}$) is at a holding voltage $V_{02}$, that a load line $L_r$ crosses a base current characteristics curve $C_B$ of the base current $I_B$ at two stable operation points $S_{01}$ and $S_{02}$. Namely, when the input signal $V_{in}$ is in the range between a voltage $V_{01}$ and a voltage $V_{03}$, the base current characteristics curve $C_B$ and the load line $L_r$ which is determined by the resistor 102, cross at the two stable points $S_{01}$ and $S_{02}$. Note, the base current characteristics curve $C_B$ and the load line $L_r$ determined by the resistor 102 also cross at the operation point $S_{03}$, but the operation state of this operation point $S_{03}$ is not maintained since the operation point $S_{03}$ exists at a negative differential resistance region of the base current $I_B$.

In FIG. 2, when the input signal $V_{in}$ is changed to a voltage lower than the voltage $V_{01}$ and then returned to the holding voltage $V_{02}$, the operation point is maintained at one stable point $S_{01}$ of the two stable operation points. Further, when the input signal $V_{in}$ is changed to a voltage higher than the voltage $V_{03}$ and then returned to the holding voltage $V_{02}$, the operation point is maintained at the other stable point $S_{02}$ of the two stable operation points. Therefore, a basic cell constituted by the RTT 101 and the resistor 102 selectively maintains one of two stable operation points $S_{01}$ and $S_{02}$ by changing the input signal $V_{in}$, and thus selective writing of data can be carried out.

In the above description, a resistor is inserted between an emitter of the RTT 101 and an earth point, and an output of the basic cell is brought out from a connection point between the resistor and the emitter. Further, a collector current $I_C$ of the RTT 101 is established as flowing primarily after appearance of the negative differential resistance of the base current $I_B$, which is shown by a dash line in FIG. 2. Because, when a SRAM is constituted by a semiconductor memory device (a basic cell) as shown in FIG. 1, large difference between the respective output conductances of the two stable positions would be required for practical use.

In the prior art semiconductor memory, for example, in a general SRAM, a flip-flop of the SRAM is constituted by a basic cell which requires a pair of transistors and a plurality of resistors or diodes, and thus there has been a limit on the capability of satisfying the requirements for high speed operation and large scale integration in recent years, even though the microscopic art of miniaturizing transistors and the like has been used. Furthermore, the semiconductor memory device using an RTT of the prior art has merits of high speed operation and large scale integration, since the RTT can operate fast and a basic cell can be constituted by only a few elements.

However, in the prior semiconductor memory device using an RTT 101 shown in FIG. 1, a base current $I_B$ relative to the base-emitter voltage $V_{BE}$ has negative differential resistance characteristics indicated by a solid line in FIG. 2. Moreover, a collector current $I_C$ has characteristics of primarily flowing after appearance of the negative differential resistance characteristics of the base current $I_B$, and characteristics of the collector current $I_C$ are indicated by a dash line in FIG. 2. Therefore, the RTT 101 used for the prior art semiconductor memory device should be produced for purposely decreasing its current gain, and a variation of the design becomes small in size and high speed operation of the RTT decreases. Furthermore, when RTTs are used for a semiconductor memory device and a logic element (for example, an exclusive NOR element), in accordance with the prior art, an RTT used for the logic element cannot be produced by the same production processes used for a semiconductor memory device, since a collector current of the RTT used for the memory device should flow primarily after appearance of the negative differential resistance characteristics of the base current $I_B$, and a collector current of the RTT used for the exclusive NOR element should have negative differential resistance characteristics like the base current $I_B$. Therefore, when resonant-tunneling transistors are used for both the exclusive NOR element and the semiconductor memory device, different resonant-tunneling transistors should be provided.

Next, a description will be given of the principle of a resonant-tunneling transistor (RTT) having a resonant-tunneling barrier for injecting electrons. This resonant-tunneling transistor includes a resonant-tunneling hot-electron transistor (RHET) and a resonant-tunneling bipolar transistor (RBT), and has negative differential resistance characteristics and high speed operation.

Figure 3B:
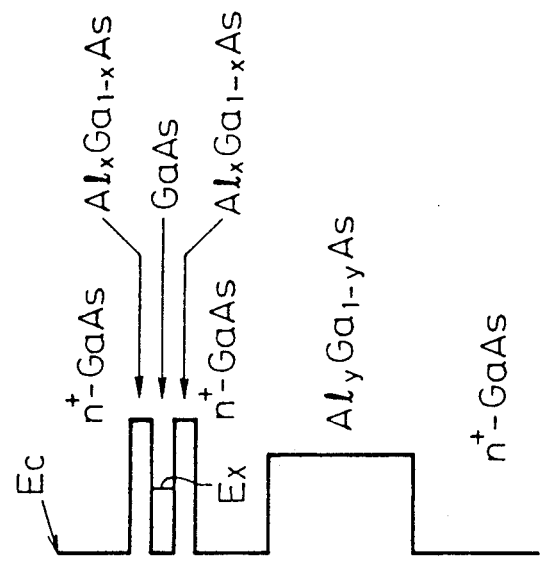
FIGS. 3a and 3b are views representing a structure and an energy state of a resonant-tunneling hot-electron transistor made of GaAs/AlGaAs.
Figure 3A:
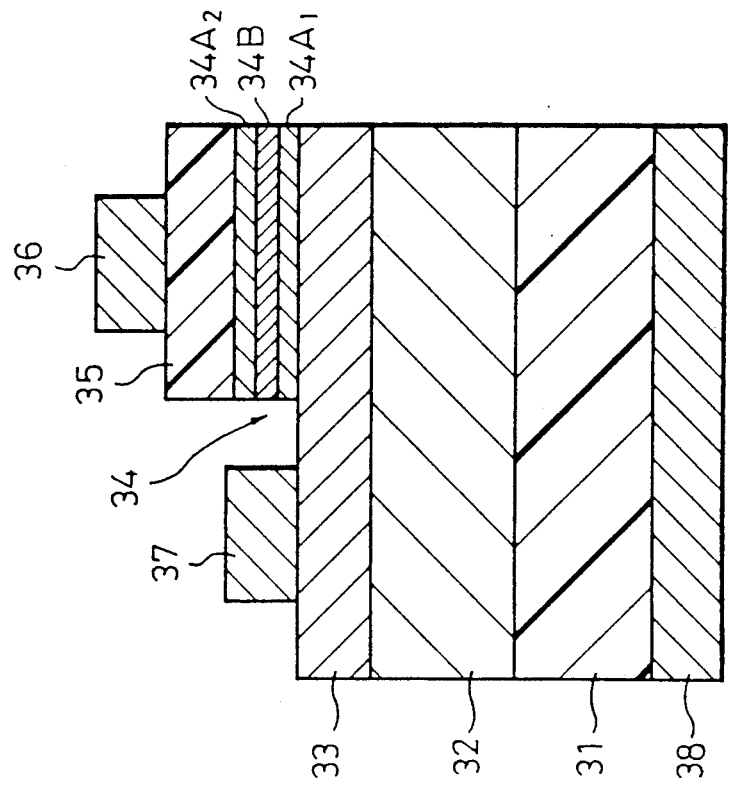

FIG. 3a is a sectional view of a semifinished RHET device made of GaAs/AlGaAs, and FIG. 3b is a graph of an energy band of the RHET device in FIG. 3a. In FIG. 3a, the resonant-tunneling transistor device consists of a collector electrode 38, an n+-type GaAs collector layer 31 formed on the collector electrode 38, a non-doped impurity $Al_yGa_{1-y}As$ collector side potential barrier layer 32 on the collector layer 31, an n+-type GaAs base layer 33 on the potential barrier layer 32, a superlattice layer 34, an n+-type GaAs emitter layer 35, an emitter electrode 36, and a base electrode 37. The superlattice layer 34 consists of an $Al_xGa_{1-x}As$ barrier layer 34A$_1$, a non-doped impurity GaAs quantum well layer 34B, and an $Al_xGa_{1-x}As$ barrier layer 34A$_2$. The superlattice layer 34 functions as an emitter side potential barrier. In this specification, the superlattice is defined as having at least one quantum well provided therein. In FIG. 3a, a plurality of quantum wells may be formed.

In FIG. 3b, reference $E_C$ represents the bottom of a conduction-energy band, and $E_X$ an energy level of a sub-band at the quantum well.

Referring to FIGS. 4a, 4b and 4c, the principle of the operation of the resonant-tunneling transistor device will be described.

FIG. 4a is a graph of an energy band of the RHET device shown in FIG. 3a. In FIG. 4a, the voltage $V_{BE}$ applied between the base layer 33 and the emitter layer 35 is lower than $2 \cdot E_X/q$, wherein q represents a charge of carriers, or is much lower than $2 \cdot E_X/q$, for example, approximately zero volts in this state, although a voltage $V_{CE}$ exists between the collector layer 31 and the emitter layer 35, electrons at the emitter layer 35 cannot reach the base layer 33 by tunneling through the superlattice layer 34, since the base-emitter voltage $V_{BE}$ is almost zero. Therefore, an energy level $E_{FE}$, namely a quasi-Fermi level, of the emitter layer 35 differs from the energy level $E_X$ at the sub-band. Accordingly, no current flows between the emitter layer 35 and the collector layer 31. Reference $\phi_C$ represents a conduction-band discontinuity.

FIG. 4b is a graph of an energy band of the RHET device, when the base-emitter voltage $V_{BE}$ is approximately equal to $2 \cdot E_X/q$. In FIG. 4b, the energy level $E_{FE}$ at the emitter layer 35 is substantially equal to the energy level $E_X$ of the sub-band at the quantum well layer 34B. As a result, due to a resonant-tunneling effect, electrons at the emitter layer 35 are passed through the superlattice layer 34 and injected into the base layer 33. The potential of the injected electrons is converted to kinetic energy, bringing the electrons to a "hot" state. The hot electrons are ballistically passed through the base layer 33 and reach the collector layer 31, and as a result, a current flows between the emitter layer 35 and the collector layer 31.

FIG. 4c is a graph of an energy band of the RHET device shown in FIG. 3a when the base-emitter voltage $V_{BE}$ is higher than $2 \cdot E_X/q$. In FIG. 4c, the energy level $E_{FE}$ at the emitter layer 35 is higher than the energy level $E_X$ of the sub-band at the quantum well layer 34B. The resonant tunneling transistor effect does not occur, and the electrons are not introduced from the emitter layer 35 into the base layer 33. Consequently, the current flowing into the RHET device is reduced. On the other hand, by decreasing the barrier height of the barrier layer 34A$_1$ adjacent to the base layer 33 to a suitable value, the electrons may directly tunnel through the barrier layer 34A$_2$ adjacent to the emitter layer 35, and as a result, a certain amount of collector current may flow.

FIG. 3c is a graph representing an energy band of a resonant-tunneling bipolar transistor (RBT) made of GaAs/AlGaAs. The RBT consists of an emitter layer of n+-type GaAs, a base layer of p+-type GaAs, and a collector layer of n+-type GaAs. The emitter layer includes a superlattice having at least one quantum well with a sub-band energy $E_x$. The base layer and the collector layer are PN-joined. The RBT also applies a resonant-tunneling effect and the principle of the operation thereof is similar to that of the RHET, and therefore, an explanation thereof is omitted.

Figure 5:
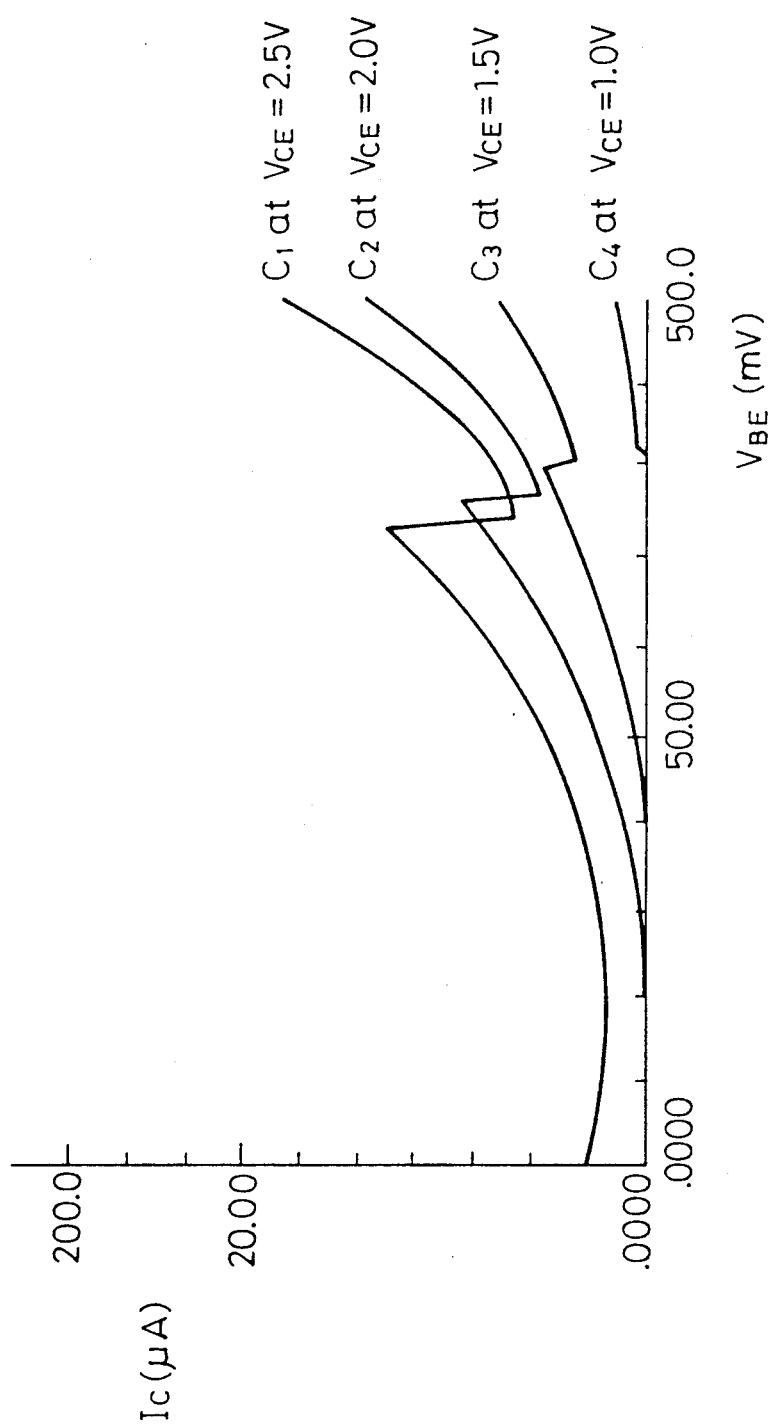

FIG. 5 is a graph illustrating the characteristics of the RHET device set forth above. In FIG. 5, the abscissa indicates the base-emitter voltage $V_{BE}$ and the ordinate indicates the collector current $I_C$. Curves $C_1$, $C_2$, $C_3$ and $C_4$ represent the characteristics when the collector-emitter voltage $V_{CE}$ are typically 2.5 volts, 2.0 volts, 1.5 volts and 1.0 volt.

The curves indicate n-shaped differential negative-resistance characteristics. The present invention uses this feature to realize a semiconductor memory device.

Figure 9:
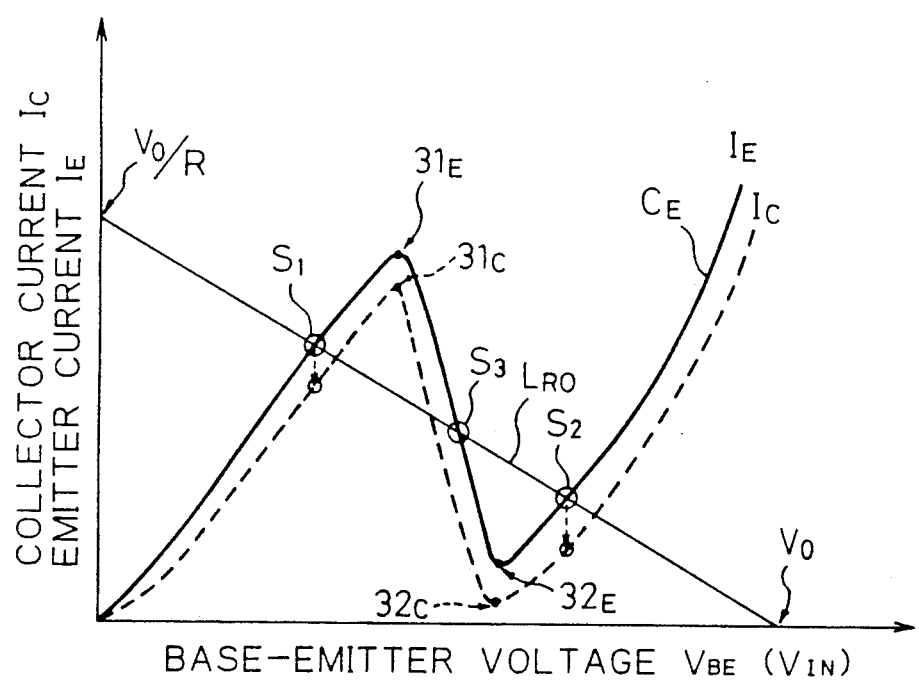
FIG. 9 is a graph illustrating characteristics of a resonant-tunneling hot-electron transistor used for the semiconductor memory device shown in FIG. 8.

Note, in an RHET used for a semiconductor memory device of the present invention, the non-doped impurity GaAs quantum well layer 34B should be formed thinner than the RHET used for the prior art semiconductor memory device of FIG. 1. Namely, when the quantum well layer 34B is formed thinly, the collector current of the RTT develops a negative differential resistance characteristic like that of the base current $I_B$, which is shown in FIG. 9. Further, in an RHET used for a semiconductor memory device of the present invention, the mole ratio of Aluminium ($Al_y$) in the non-doped impurity $Al_yGa_{1-y}As$ collector side potential barrier layer 32 should be smaller than that of the RHET used for the prior art semiconductor memory device of FIG. 1. Namely, when the content of Aluminium is small, that is, the mole ratio y is a small value, the collector current of the RTT develops a negative differential resistance characteristic such as that of the base current $I_B$.

Figure 6B:
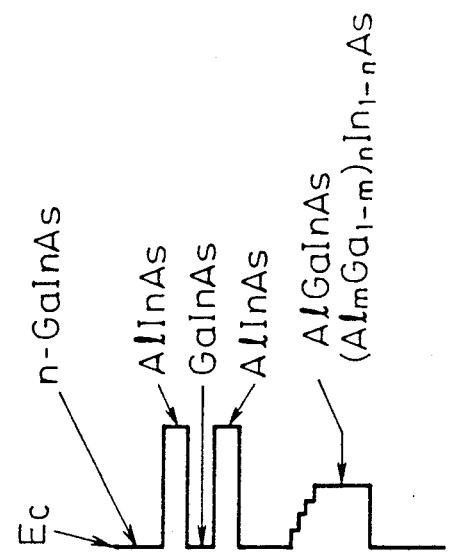
FIGS. 6a and 6b are views representing a structure and an energy state of a resonant-tunneling hot-electron transistor made of GaInAs/(AlGa)InAs.
Figure 6A:
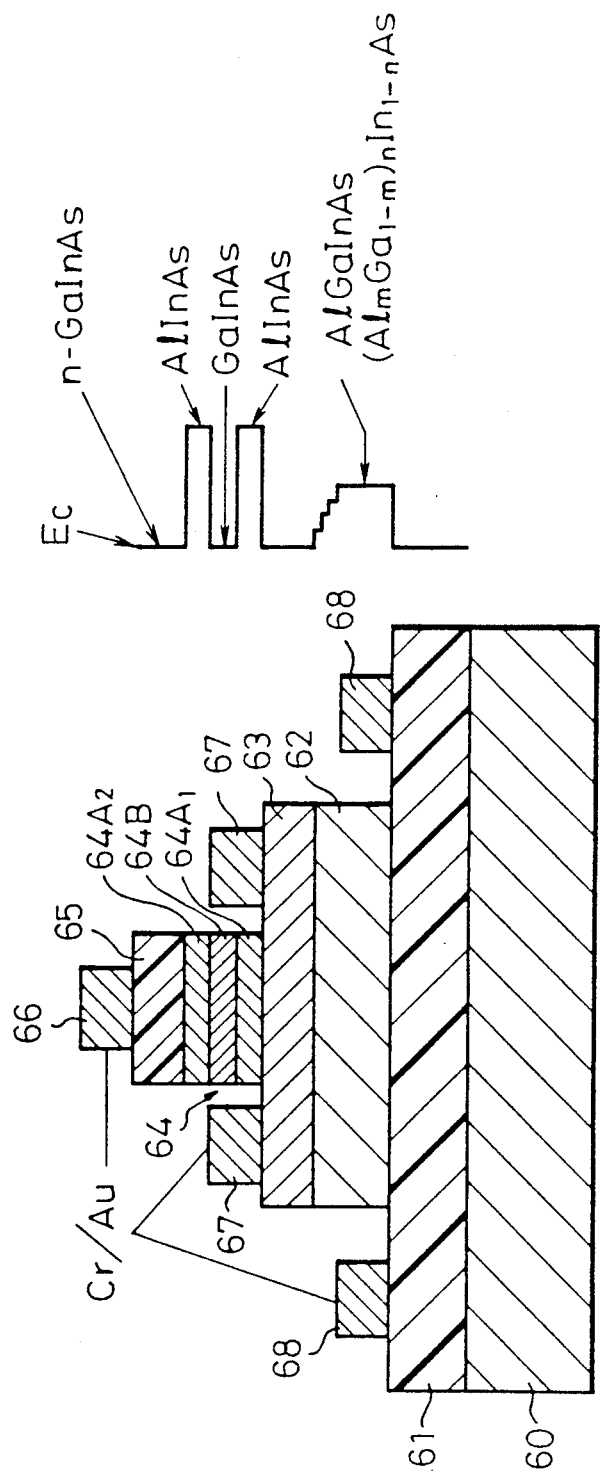

FIGS. 6a and 6b are views representing the structure and energy states of a resonant-tunneling hot-electron transistor made of GaInAs/(AlGa)InAs. The GaInAs/(AlGa)InAs RHET has a preferable characteristic to that of the GaAs/AlGaAs RHET described above. In FIG. 6a, the resonant-tunneling transistor device consists of an InP substrate 60, an n-type GaInAs collector layer 61 formed on the substrate 60, a non-doped impurity $(Al_mGa_{1-m})_nIn_{1-n}As$ collector barrier layer 62 formed on the collector layer 61, an n-type GaInAs base layer 63 formed on the collector barrier layer 62, a superlattice layer 64, an n-type GaInAs emitter layer 65, an emitter electrode 66, a base electrode 67, and a collector electrode 68. The superlattice layer 64 consists of a quantum well layer 64B and two barrier layers 64A$_1$ and 64A$_2$, the quantum well layer 64B being sandwiched between the two barrier layers 64A$_1$ and 64A$_2$.

Note, the Γ-L valley separation energy of the GaInAs/(AlGa)InAs RHET is higher than that of the GaAs/AlGaAs RHET.

Note, in an RHET used for a semiconductor memory device of the present invention, the quantum well layer 64B should be formed thinner than the RHET used for the prior art semiconductor memory device of FIG. 1, the same as for the RHET shown in FIGS. 3a to 6b. Namely, when the quantum well layer 64B is formed thinly, a collector current of the RTT develops a negative differential resistance characteristic like that of the base current $I_B$, which is shown in IFG. 9. Further, in an RHET used for a semiconductor memory device of the present invention, the mole ratio of Aluminium-Gallium $((Al_mGa_{1-m})_n)$ in the non-doped impurity $(Al_mGa_{1-m})_nIn_{1-n}As$ collector barrier layer 62 should be smaller than that of the RHET used for the prior art semiconductor memory device of FIG. 1. Namely, when the content of Aluminium-Gallium is small, that is, the mole ratio n is a small value, a collector current of the RTT develops a negative differential resistance characteristic like that of the base current $I_B$.

Next, preferred embodiments of the present invention will be described.

Below, an example of a semiconductor memory device of the present invention will be explained with reference to the drawings.

Figure 7:
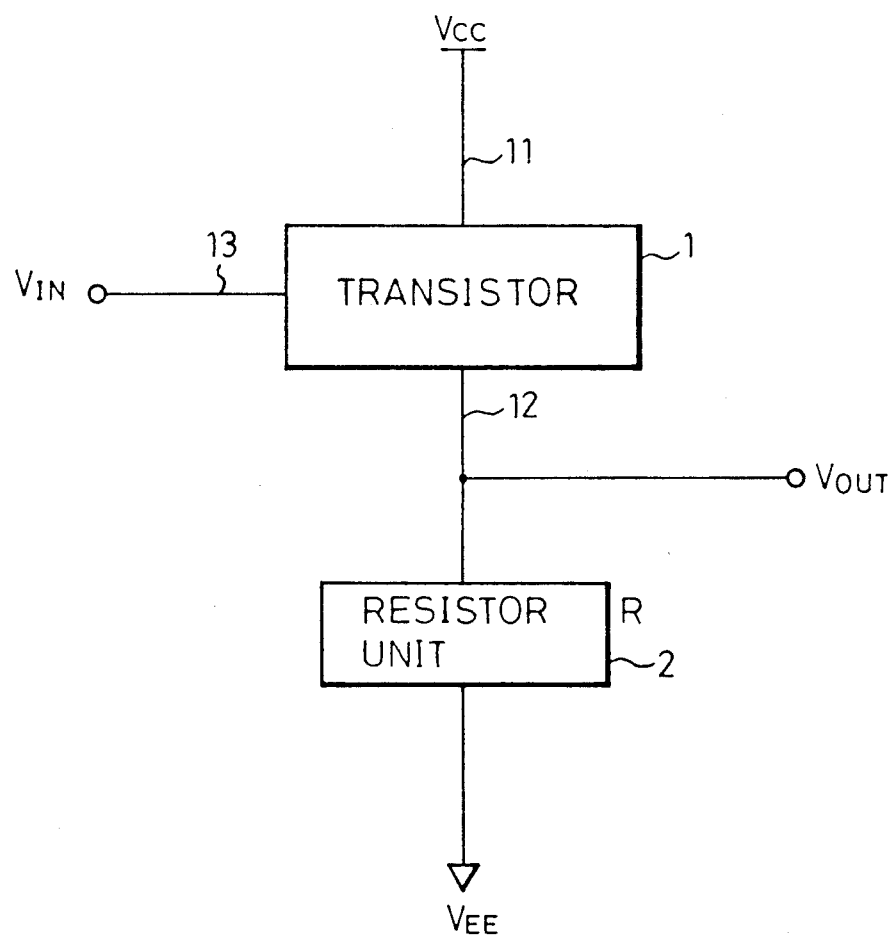
FIG. 7 is a circuit block diagram of a principle of a semiconductor memory device according to the present invention.

FIG. 7 is a circuit block diagram for explaining the principle of a semiconductor memory device according to the present invention. According to the present invention, there is provided a semiconductor memory device comprising a first power supply unit $V_{CC}$, a second power supply unit $V_{EE}$, a transistor 1 having a first electrode 11, a second electrode 12 and a third electrode 13 and a resistor unit 2. The first electrode 11 of the transistor 1 is connected to the first power supply unit $V_{CC}$, the second electrode 12 is connected to the second power supply unit $V_{EE}$, the third electrode 13 of the transistor 1 is supplied with an input signal $V_{IN}$ for selectively maintaining one of two different operating states of the transistor 1, and the transistor 1 has a negative differential resistance characteristic.

The resistor unit 2 is connected between the second electrode 12 of the transistor 1 and the second power supply unit $V_{EE}$, and an output signal $V_{OUT}$ is brought out from a connection point between the second electrode 12 of the transistor 1 and the resistor unit 2.

Figure 8:
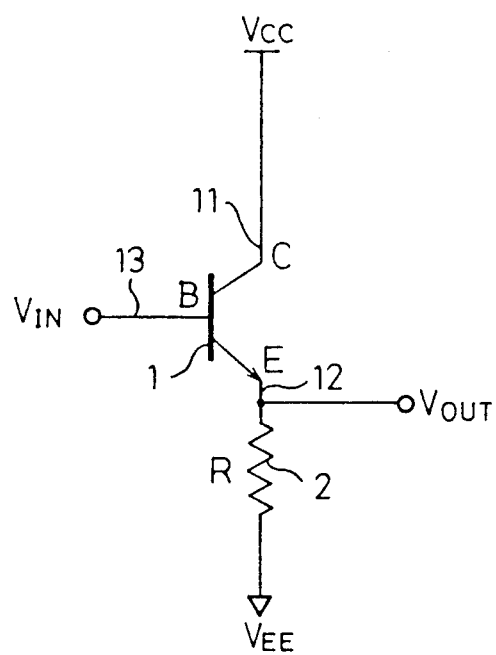
FIG. 8 is a circuit diagram of one embodiment of the semiconductor memory device according to the present invention.

FIG. 8 is a circuit diagram of one embodiment of the semiconductor memory device according to the present invention, and FIG. 9 is a graph illustrating characteristics of the resonant-tunneling hot-electron transistor used for the semiconductor memory device shown in FIG. 8.

The present embodiment uses a resonant-tunneling hot-electron transistor (RHET) 1 as a resonant-tunneling transistor (RTT) having negative differential resistance characteristics in the emitter current or the source current thereof. A collector 11 of the RHET 1 is supplied with a high power supply voltage $V_{CC}$, an emitter 12 thereof is supplied with a low power supply voltage $V_{EE}$ (for example, zero volts) through a resistor 2, and a base 13 thereof is supplied with an input signal $V_{IN}$. Further, an output signal $V_{OUT}$ is brought out from a connection point between the emitter 12 of the RHET 1 and the resistor 2.

Note, the RHET 1 used for the semiconductor memory device of the present embodiment has operation characteristics (N-shaped characteristics: negative differential resistance characteristics), that is, as shown in FIG. 9, an emitter current $I_E$ of a vertical axis is increased, decreased, and again increased in accordance with an increase in the base-emitter voltage $V_{BE}$ (input signal $V_{IN}$) of a transverse axis. Further, a collector current $I_C$, which is similar to the emitter current $I_E$, has negative differential resistance characteristics of being increased, decreased, and again increased in accordance with an increase in an input signal $V_{IN}$. Namely, the emitter current $I_E$ and the collector current $I_C$ have respective N-shaped characteristics which are increased from zero to peaks $31_E$ and $31_C$, decreased from the peaks $31_E$ and $31_C$ to valleys $32_E$ and $32_C$, and again increased from the valleys $32_E$ and $32_C$ in accordance with an increase in the input signal $V_{IN}$. The RTT having the above characteristics can be produced with several variations in design, and sufficiently high speed characteristics. Furthermore, when an exclusive NOR element is constituted by using an RTT having negative differential resistance characteristics of the collector current $I_C$, and also when a basic cell is constituted by using an RTT having negative differential resistance characteristics of the emitter current $I_E$, the RTT used for the exclusive NOR element and the RTT used for the memory cell can be formed on same substrate since these RTTs have the same characteristics.

The emitter current characteristics curve $C_E$ and the load line $L_{R0}$ determined by a resistance value R of the resistor 2 cross at two stable operation points $S_1$ and $S_2$. Note, the load line $L_R$, which will be described later, shows a case wherein the value of the input signal $V_{IN}$ is at a holding voltage $V_0$. Further, the emitter current characteristics curve $C_E$ and a load line $L_R$ also cross at the operation point $S_3$, but the operation state of this operation point $S_3$ is not maintained since the operation point $S_3$ exists at a negative differential resistance region of the emitter current $I_E$.

Figure 10:
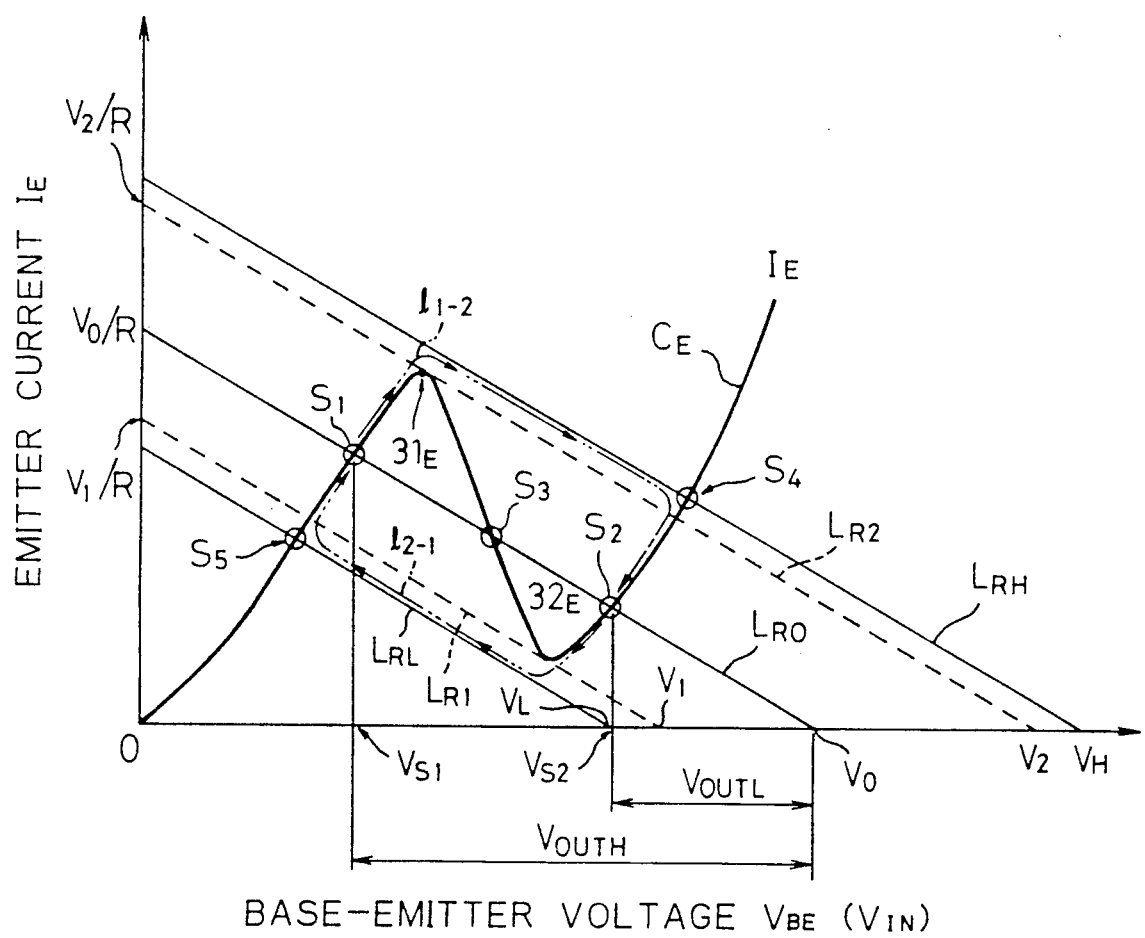
FIG. 10 is a diagram for explaining an operation of the semiconductor memory device shown in FIG. 8.

FIG. 10 is a diagram for explaining an operation of the semiconductor memory device shown in FIG. 8. In FIG. 10, a low level specified voltage $V_1$ is determined when a load line $L_{R1}$ (which is indicated by a dash line in FIG. 10) due to the resistance value R contacts to the emitter current characteristics curve $C_E$ at a position close to a valley $32_E$ of the emitter current characteristics curve $C_E$, and a high level specified voltage $V_2$ is determined when a load line $L_{R2}$ (which is indicated by a dash line in FIG. 10) due to the resistance value R contacts the emitter current characteristics curve $C_E$ at a position close to a peak $31_E$ of the emitter current characteristics curve $C_E$.

A load line $L_{R0}$ is determined by the holding voltage $V_0$ and the resistance value R, in this case the holding voltage $V_0$ should be such that the emitter current characteristics curve $C_E$ and the load line $L_{R0}$ cross at the two stable points $S_1$ and $S_2$, that is, a holding voltage $V_0$ suitable for being determined at about the middle voltage value between the low level specified voltage $V_1$ and the high level specified voltage $V_2$.

A low level signal voltage $V_L$ is a voltage value for transferring, and maintaining, the semiconductor memory device (basic cell) having the RTT 1 and the resistor shown in FIG. 8 to, and at, the stable position of the operation point $S_1$, and the low level signal voltage $V_L$ should be a voltage value lower than the low level specified voltage $V_1$. Further, a high level signal voltage $V_H$ is a voltage value for transferring, and maintaining, the basic cell to, and at, the stable position of the operation point $S_2$, and the high level signal voltage $V_H$ should be a voltage value higher than the high level specified voltage $V_2$.

Figures 11A, 11B:
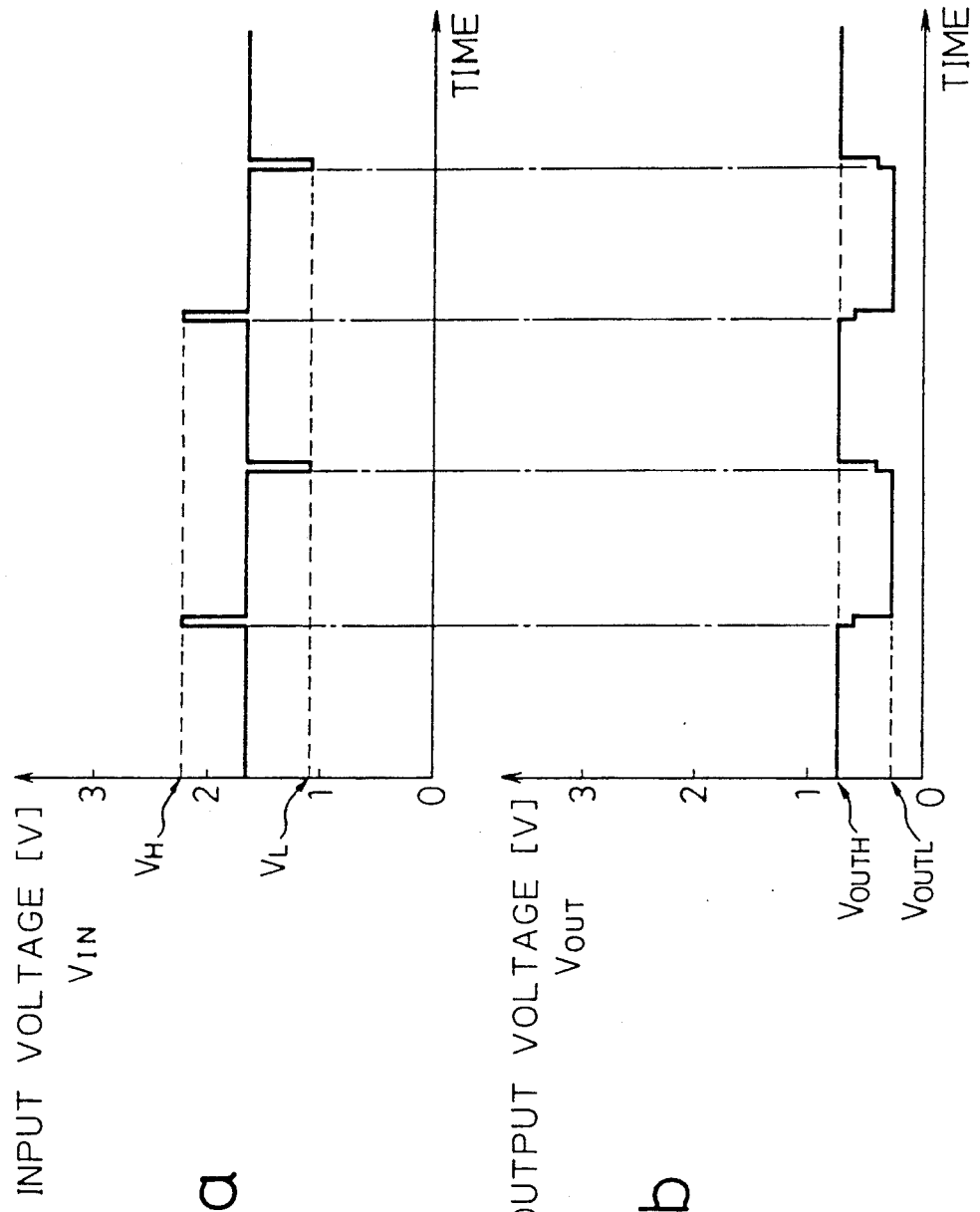
FIGS. 11a and 11b are signal waveform diagrams for explaining an operation of the semiconductor memory device shown in FIG. 10.

FIGS. 11a and 11b are signal waveform diagrams for explaining an operation of the semiconductor memory device shown in FIG. 10, and FIG. 11a indicates an input signal and FIG. 11b indicates an output signal. The basic cell shown in FIG. 8 can be selectively maintained at one of the two different stable states by using the holding voltage $V_0$, the low level signal voltage $V_L$ and the high level signal voltage $V_H$ as in the above description. For example, when the basic cell is at a state of the stable point $S_1$ and a holding voltage $V_0$ is applied, an output signal $V_{OUT}$ is maintained at a high level signal $V_{OUTH}$ ($=V_0-V_{S1}$). However, when a high level signal voltage $V_H$ is input as an input signal $V_{IN}$ and then the holding voltage $V_0$ is applied again, the basic cell comes to the stable point $S_2$ through a path $l_{1-2}$ (which is indicated by a two-dots-dash line in FIG. 10) passing a cross point $S_4$ between the the emitter current characteristics curve $C_E$ and the load line $L_{RH}$, since the high level signal voltage $V_H$ has a higher potential than the high level specified voltage $V_2$. Note, in this case, the output signal $V_{OUT}$ is a low level signal $V_{OUTL}$ ($=V_0-V_{S2}$).

Further, when the basic cell is at the stable point $S_2$ and a holding voltage $V_0$ is applied, an output signal $V_{OUT}$ is maintained at the low level signal $V_{OUTL}$. However, when a low level signal voltage $V_L$ is input as an input signal $V_{IN}$ and then the holding voltage $V_0$ is applied again, the basic cell comes to the stable point $S_1$ through a path $l_{2-1}$ (which is indicated by a two-dots-dash line in FIG. 10) passing a cross point $S_5$ between the the emitter current characteristics curve $C_E$ and the load line $L_{RL}$, since the low level signal voltage $V_L$ is at a lower potential than the low level specified voltage $V_1$. Note, in this case, the output signal $V_{OUT}$ is the high level signal $V_{OUTH}$.

As described above, when changing an input signal $V_{IN}$ determined at a holding voltage $V_0$ to a high level signal voltage $V_H$ to a low level signal voltage $V_L$, and then changing the input signal $V_{IN}$ to the holding voltage $V_0$ again, that is, when adding a pulse of the high level signal voltage $V_H$ or of the low level signal voltage $V_L$ to the input signal $V_{IN}$ in which is maintained at the holding voltage $V_0$, the basic cell is selectively maintained at one of the two stable points $S_1$ and $S_2$ which are crossing points between the emitter current characteristics curve $C_E$ and the load line $L_{R0}$. In the above description, an output signal $V_{OUT}$ of the basic cell is at a high level signal $V_{OUTH}$ when the state of the stable point $S_1$ is maintained, and an output signal $V_{OUT}$ of the basic cell is at a low level signal $V_{OUTL}$ when the state of the stable point $S_2$ is maintained. Therefore, when adding a pulse of the high level signal voltage $V_H$ to the input signal $V_{IN}$, the low level signal $V_{OUTL}$ is continuously output, and when adding a pulse of the low level signal voltage $V_L$ to the input signal $V_{IN}$, the high level signal $V_{OUTH}$ is continuously output, so that data can be maintained by these two different output signals. Note, these output signals $V_{OUTH}$ and $V_{OUTL}$ are inverted signals of the input signals $V_{IN}$, and thus an inverter circuit and the like having a memory function can be constituted by using this basic cell and its applicability can thus be widened. Furthermore, in the semiconductor memory device of the present embodiment, an output signal is brought out from the emitter, this output signal has a specific gain due to the N-shaped characteristics of the transistor 1, and thus the semiconductor memory device of the present embodiment can be directly connected to the next stage circuits.

Figure 12:
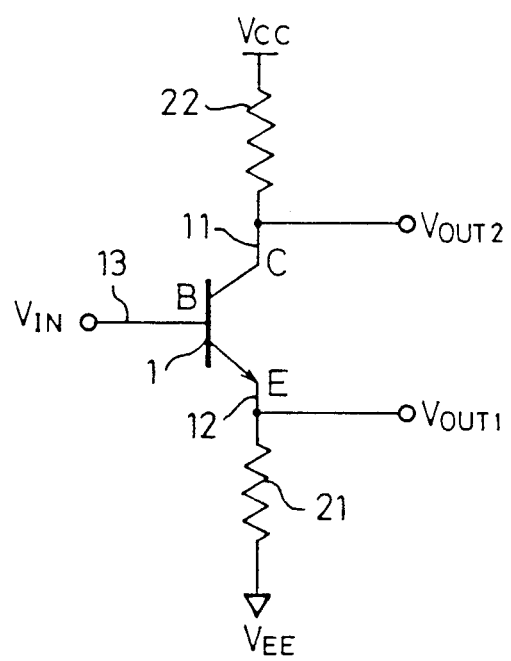
FIG. 12 is a circuit diagram of another embodiment of the semiconductor memory device according to the present invention.
Figures 13A, 13B:
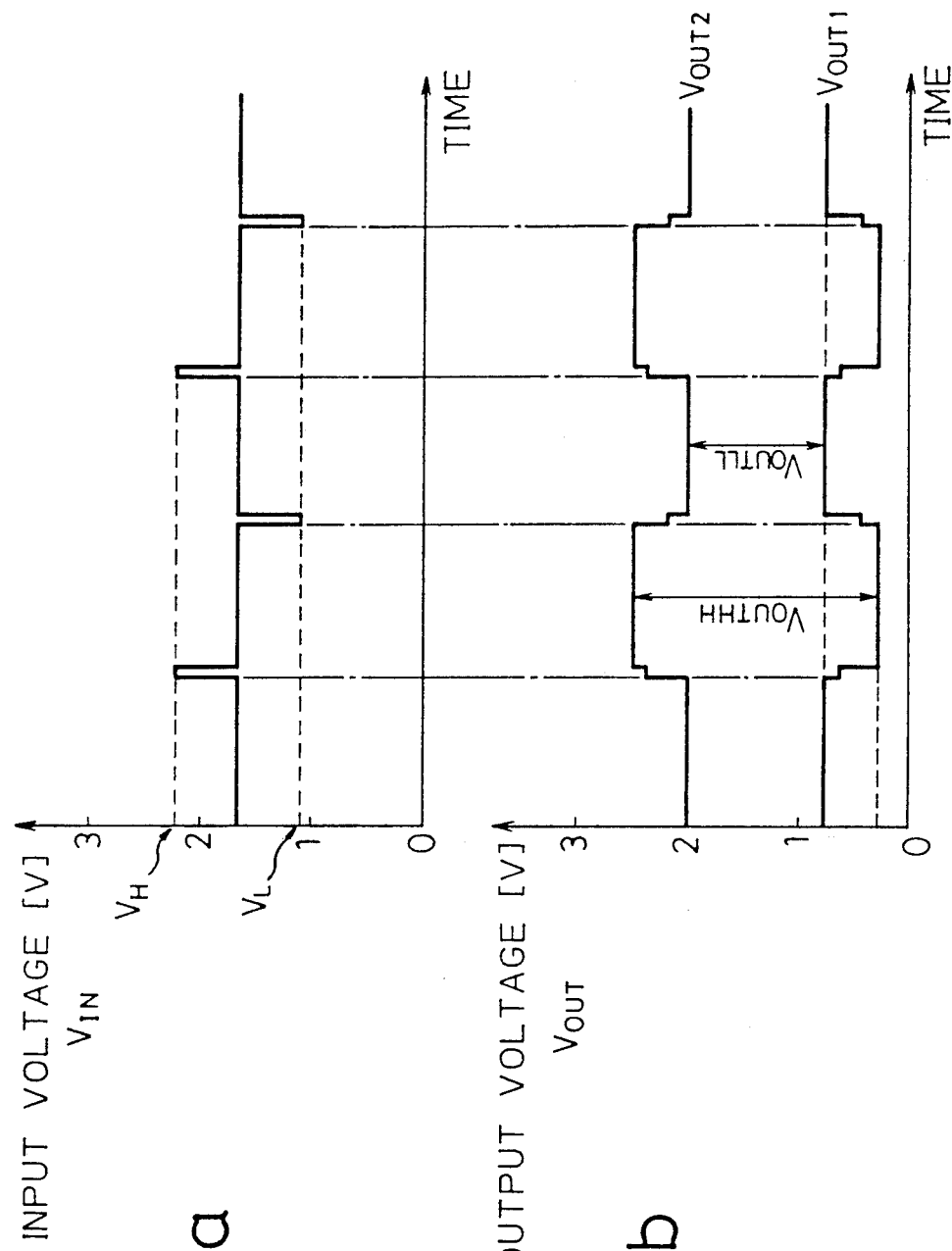
FIGS. 13a and 13b are signal waveform diagrams for explaining an operation of the semiconductor memory device shown in FIG. 12.

FIG. 12 is a circuit diagram of another embodiment of the semiconductor memory device according to the present invention. FIGS. 13a and 13b are signal waveform diagrams for explaining an operation of the semiconductor memory device shown in FIG. 12, and FIG. 13a indicates an input signal and FIG. 13b indicates an output signal. In the semiconductor memory device shown in FIG. 12, a resistor 21 is inserted between the emitter 12 of the RTT 1 and the low power supply $V_{EE}$, and a first output signal $V_{OUT1}$ is brought out from a connection point between the emitter 12 and the resistor 21. Further, a resistor 22 is inserted between the collector 11 of the RTT 1 and the high level power supply $V_{CC}$, and a second output signal $V_{OUT2}$ is brought out from connection point between the collector 11 and the resistor 22. Note, as shown in FIG. 13, the first output signal $V_{OUT1}$ and the second output signal $V_{OUT2}$ are complementary signals, that is, when the first output signal $V_{OUT1}$ is at a high level, then the second output signal $V_{OUT2}$ is at a low level. Therefore, this embodiment is preferable when complementary signals are required, and erroneous operation can be decreased by using these complementary signals. Further, a high level signal voltage $V_{OUTHH}$ and a low level signal voltage $V_{OUTLL}$ can be produced by using a differential voltage between the two output signals $V_{OUT1}$ and $V_{OUT2}$.

As described above, for example, in comparison to a prior art general use SRAM, high speed operation and large scale integration can be enabled in the semiconductor memory device of the present invention, since the present semiconductor memory device uses an RTT element having high speed operation and a single resistor. Further, in comparison to a prior art semiconductor memory device using an RTT element, the semiconductor memory device of the present invention does not need to be produced for purposely decreasing a current gain of the RTT, and thus variations in the design of the present device become increased and suficiently high speed operation of the RTT is obtained.

Furthermore, in the semiconductor memory device of the present invention, an exclusive NOR element using an RTT which has negative differential resistance characteristics of its collector current can be formed on the same substrate where a basic cell of the memory device is formed.

In the above description, a transistor used for the semiconductor memory device of the present invention is explained as an RHET (resonant-tunneling hot-electron transistor), but the semiconductor memory device can be a resonant-tunneling transistor which has a resonant-tunneling barrier for injecting carriers, such as an RBT (resonant-tunneling bipolar transistor) having negative differential resistance characteristics of an emitter current, an FET having negative differential resistance characteristics of a source current, and the like. Further, a transistor used for the semiconductor memory device of the present invention is not only an RTT, but also a transistor having negative differential resistance characteristics of its emitter current or its source current, e.g., a real space transition transistor.

Below, an example of a nine-bit random number generator device using the semiconductor memory device of the present invention will be explained with reference to FIGS. 14 to 19.

Figure 14:
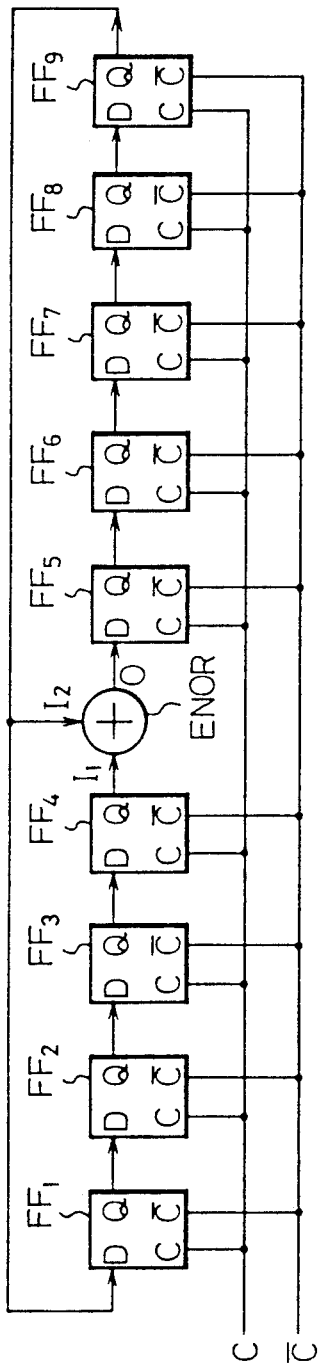
FIG. 14 is a block circuit diagram of an example of a nine-bit random number generator device using D-type flip-flops and an exclusive NOR element.
Figure 15:
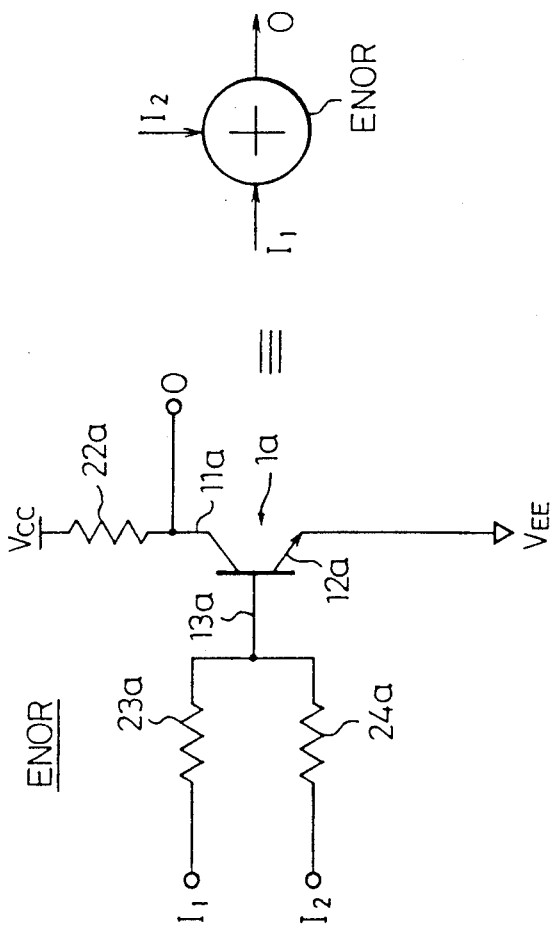
FIG. 15 is a circuit diagram of the exclusive NOR element shown in FIG. 14, using a resonant-tunneling transistor.
Figure 16:
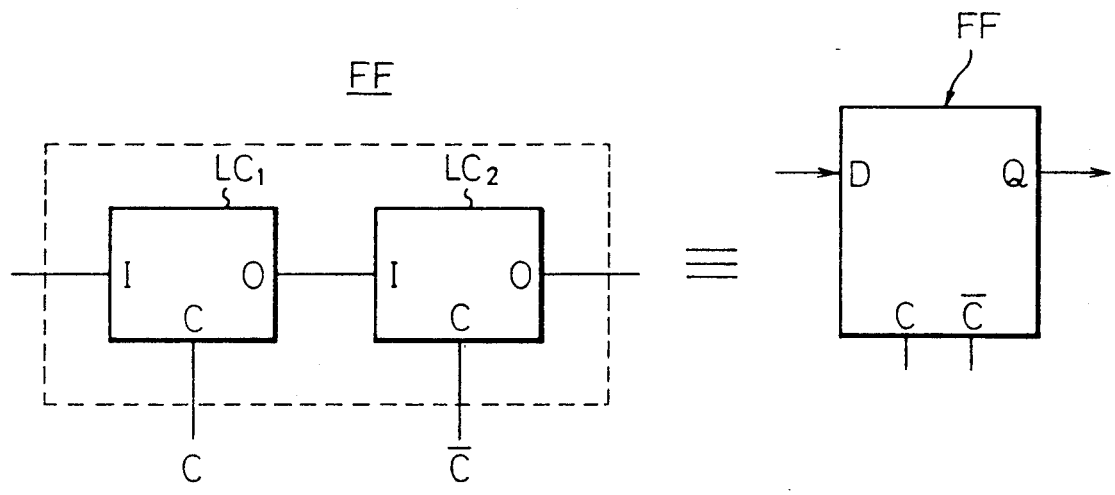
FIG. 16 is a block circuit diagram of the D-type flip-flop shown in FIG. 14, using two latch circuits.
Figure 17:
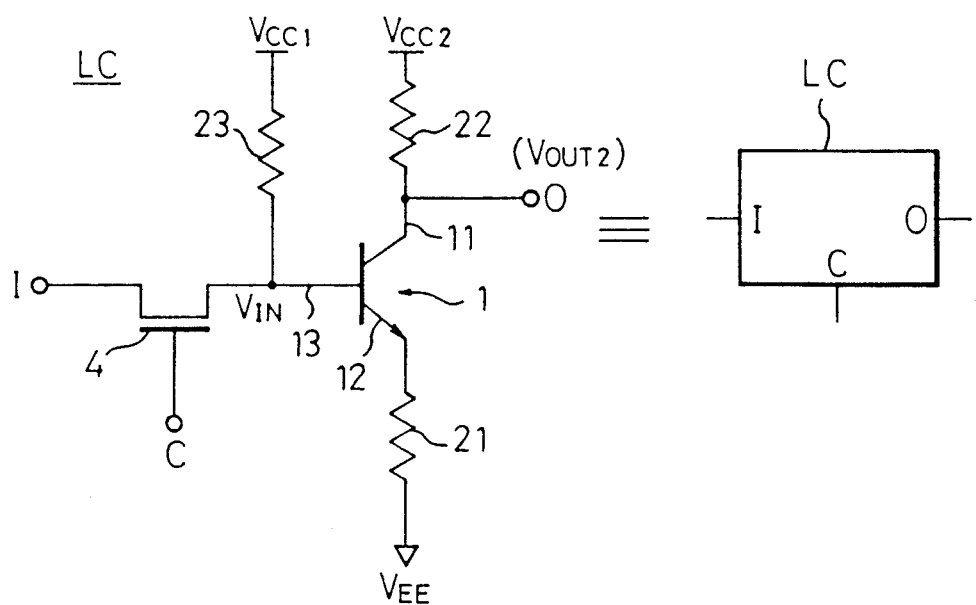
FIG. 17 is a circuit diagram of the latch circuit shown in FIG. 16.

FIG. 14 is a block circuit diagram of an example of a nine-bit random number generator device using D-type flip-flops and an exclusive NOR element (ENOR), FIG. 15 is a circuit diagram of the exclusive NOR element shown in FIG. 14, using a resonant-tunneling transistor, FIG. 16 is a block circuit diagram of the D-type flip-flop shown in FIG. 14, using two latch circuits, and FIG. 17 is a circuit diagram of the latch circuit shown in FIG. 16. As shown in FIG. 14, a nine-bit random number generator device is constituted by nine D-type flip-flops $FF_1$ to $FF_9$ and an exclusive NOR element ENOR. Note, the exclusive NOR element ENOR is an example of a logic element, and the D-type flip-flop which includes two latch circuits is an example of a device using the semiconductor memory device according to the present invention.

A Q-terminal of a first flip-flop $FF_1$ is connected to a D-terminal of a second flip-flop $FF_2$, a Q-terminal of the second flip-flop $FF_2$ is connected to a D-terminal of a third flip-flop $FF_3$, a Q-terminal of an eighth flip-flop $FF_8$ is connected to a D-terminal of a ninth flip-flop $FF_9$, and a Q-terminal of the ninth flip-flop $FF_9$ is connected to a D-terminal of the first flip-flop $FF_1$. Note, the exclusive NOR element ENOR is inserted between a fourth flip-flop $FF_4$ and a fifth flip-flop $FF_5$, that is, a Q-terminal of the fourth flip-flop $FF_4$ is connected to a first input $I_1$ of the exclusive NOR element ENOR and an output O of the exclusive NOR element ENOR is connected to a D-terminal of the fifth flip-flop $FF_5$, and a second input $I_2$ of the exclusive NOR element ENOR is supplied with an output signal of the Q-terminal of the ninth flip-flop $FF_9$. Further, C-terminals of the flip-flops $FF_1$ to $FF_9$ are supplied with a clock signal and $\overline{C}$-terminals of the flip-flops $FF_1$ to $FF_9$ are supplied with an inverted clock signal $\overline{C}$.

As shown in FIG. 15, the exclusive NOR element ENOR is constituted by an RTT $1a$ and three resistors $22a$ to $24a$. A collector $11a$ of the RTT $1a$ is connected to a power supply voltage unit $V_{cc}$ through the resistor $22a$, and an emitter $12a$ of the RTT $1a$ is grounded (connected to a power supply $V_{EE}$). The first input $I_1$ of the exclusive NOR element ENOR is connected to a base $13a$ of the RTT $1a$ through the resistor $23a$, and the second input $I_2$ thereof is connected to the base $13a$ of the RTT $1a$ through the resistor $24a$. An output O of the exclusive NOR element ENOR is brought out from a connection point between the collector $11a$ and the resistor $22a$.

As shown in FIG. 16, the D-type flip-flop FF ($FF_1$ to $FF_9$) is constituted by two latch circuits $LC_1$ and $LC_2$. An output terminal O of a first latch circuit $LC_1$ is connected to an input terminal I of a second latch circuit $LC_2$, an input I of the first latch circuit $LC_1$ is regarded as a D-terminal of the flip-flop FF, an output O of the second latch circuit $LC_2$ is regarded as a Q-terminal of the flip-flop FF, a clock input C of the first latch circuit $LC_1$ is regarded as a clock terminal C of the flip-flop FF, and a clock input C of the second latch circuit $LC_2$ is regarded as an inverted clock terminal $\overline{C}$ of the flip-flop FF.

As shown in FIG. 17, the latch circuit LC is constituted by an RTT 1, three resistors 21 to 23 and a FET (which is a transfer gate) 4. Note, a semiconductor memory device of the present invention shown in FIG. 12, which is constituted by the RTT 1 and two resistors 21 and 22, is applied to the latch circuit LC. Namely, a collector 11 of the RTT 1 is connected to a power supply voltage unit $V_{CC2}$ through the resistor 22, and an emitter 12 of the RTT 1 is grounded (connected to a power supply $V_{EE}$) through the resistor 21. The input I of the latch circuit LC is connected to a base 13 (which is an input $V_{IN}$ of the semiconductor memory device) of the RTT 1 through the FET 4, a gate of the FET 4 is supplied with the clock signal C (or $\overline{C}$), and the base 13 of the RTT 1 is connected to a power supply voltage unit $V_{CC1}$ through the resistor 23. An output O (which is a second output signal $V_{OUT2}$ of the semiconductor memory device) of the latch circuit LC is brought out from a connection point between the collector 11 and the resistor 22.

Figure 18:
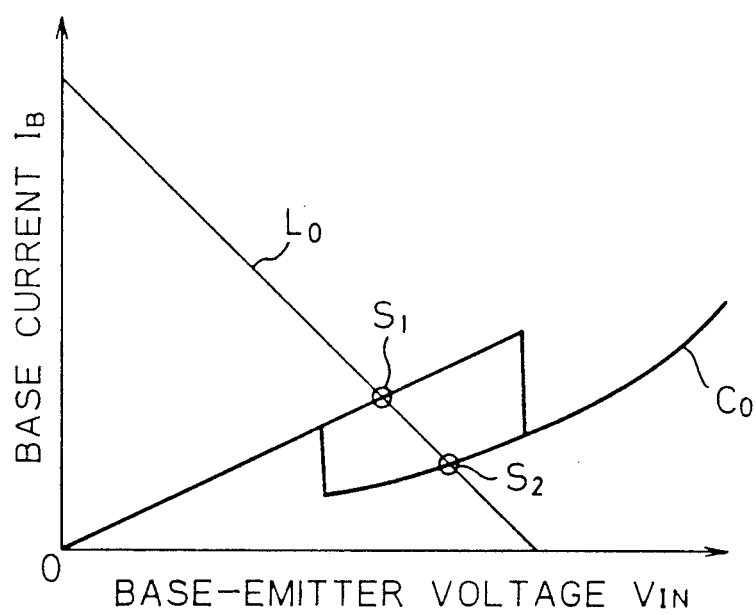
FIGS. 18 and 19 are diagrams for explaining the operation of the latch circuit shown in FIG. 17.
Figure 19:
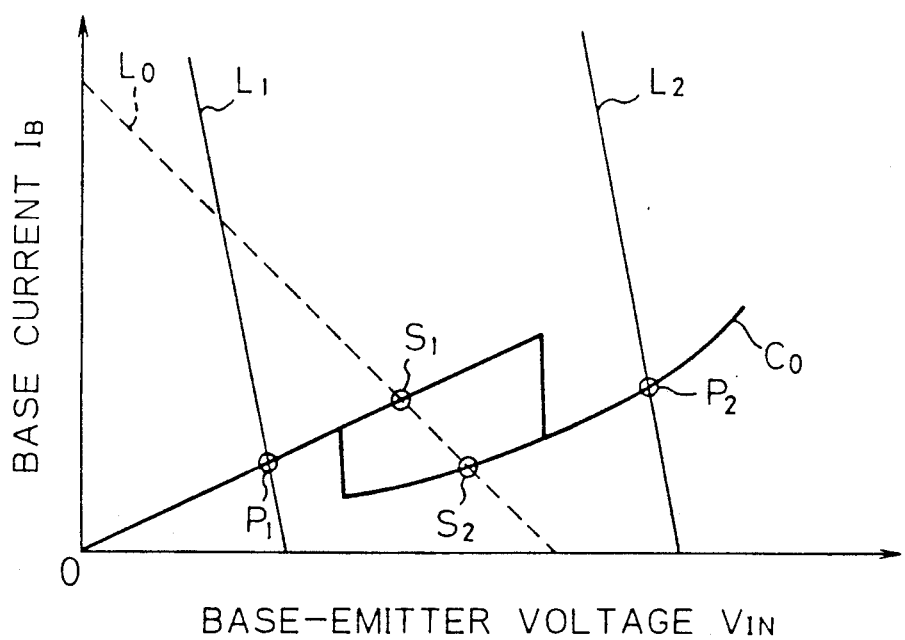

FIGS. 18 and 19 are diagrams for explaining operations of the latch circuit shown in FIG. 17, FIG. 18 is the case of the transfer gate (FET) 4 being cut OFF, and FIG. 19 is the case of the transfer gate 4 being ON. Note, an operation of the transfer gate 4 is controlled by the clock signal C. These diagrams correspond to the diagrams in FIGS. 9 and 10.

In FIGS. 18 and 19, reference $C_0$ indicates a characteristic curve resulting from operational characteristics of the RTT 1 and a resistance value of the resistor 21 in the latch circuit LC shown in FIG. 17, and reference $L_0$ indicates a load line determined by a resistance value of the resistor 23. Note, the load line $L_0$ corresponds to the case of applying a holding voltage to an input $V_{IN}$ of the semiconductor memory device shown. As shown in FIGS. 18 and 19, the characteristic curve $C_0$ and the load line $L_0$ cross at two stable points $S_1$ and $S_2$. Note, an output signal of the latch circuit LC is at a low level in operation state of the stable point $S_1$, and the output signal of the latch circuit LC is at a high level in the operation state of the stable point $S_2$.

In FIG. 19, reference $L_1$ indicated a load line when an input signal is at a low level and reference $L_2$ indicates a load line when an input signal is at a high level. For example, when the transfer gate 4 is cut OFF and the latch circuit LC is at the state of the stable point $S_1$, an output O of the latch circuit LC is maintained at a low level. Further, when the input signal is at a high level (load line $L_2$) and then the transfer gate 4 is cut OFF, the latch circuit LC comes to the stable point $S_2$ through an intermediate point $P_2$.

Consequently, an output O of the latch circuit LC is changed and maintained at a high level. Conversely, when the transfer gate 4 is cut OFF and the latch circuit LC is at the stable point $S_2$, an output O of the latch circuit LC is maintained at a high level. Further, when the input signal is at a low level (load line $L_1$) and then the transfer gate 4 is cut OFF, the latch circuit LC comes to the stable point $S_1$ through an intermediate point $P_1$.

As described above, when RTTs are used for a semiconductor memory device (for example, a D-type flip-flop) and a logic element (for example, an exclusive NOR element), in accordance with the present invention, an RTT used for a logic element can be produced by the same production processes as used for the semiconductor memory device, since collector currents of the RTTs used for the memory device and the exclusive NOR element have the same negative differential resistance characteristics as the base current $I_B$. Therefore, a device having resonant-tunneling transistors used for both a semiconductor memory device and a logic element such as a random number generator device can be easily produced.

In accordance with the present invention as described above, a semiconductor memory device comprises a transistor which has negative differential resistance characteristics in the emitter current or the source current thereof and a resistor unit, so that the semiconductor memory device has few elements and a simplified configuration, and high speed operation and a large scale integration can be effected, and moreover, many variations in design become possible.

Many widely different embodiments of the present invention may be constructed without departing from the spirit and scope of the present invention, and it should be understood that the present invention is not limited to the specific embodiments described in this specification, except as defined in the appended claims.

I claim:

1. A semiconductor memory device comprising:
   a first power supply line;
   a second power supply line;
   an input terminal;
   a transistor having first, second and third semiconductor layers, first, second and third electrodes respectively coupled to said first, second and third layers, and a superlattice structure between said second and third layers, said superlattice structure including first and second barrier layers and at least one quantum well layer having a sub-band therein and provided between said first and second barrier layers, said first electrode being operatively connected to said first power supply line, said second electrode being operatively connected to said second power supply line, and said third electrode being operatively connected to said input terminal, said transistor exhibiting a negative differential resistance characteristic with respect to the flow of current between said first layer and said second layer relatively to the voltage between said third layer and said second layer, whereby when minority carriers are injected from said second layer to said third layer through said sub-band, the energy level of the bottom of the conduction band formed between said third layer and said first layer is lower than the energy level specified by said injected minority carriers, said transistor correspondingly having two different, stable operating states and being selectively operable to maintain a selected one of said two different, stable operating states;
   a resistor connected between said second power supply line and said second electrode at corresponding connection portions; and
   an output terminal connected to the connection portion between said second power supply line and said second electrode, said device producing an output at said output terminal corresponding to the selected, maintained stable operating state of said transistor.

2. A semiconductor memory device according to claim 1, wherein said transistor further comprises:
   a third barrier layer provided between said third layer and said first layer;
   said second layer, said third layer, and said first layer are formed of the same conduction type semiconductor material; and
   the energy level of the bottom of said third barrier is lower than the energy level specified by said injected minority carriers.

3. A semiconductor memory device according to claim 2, wherein said first layer, said second layer and said third layer are made of GaAs; and said third barrier layer is made of non-doped impurity $Al_yGa_{y-1}As$.

4. A semiconductor memory device according to claim 1, wherein each of said first layer and said second layer is formed of a semiconductor material of a first conduction type, said third layer is formed of a semiconductor material of a second conduction type, opposite to said first conduction type, and a PN-junction is formed at the interface of said first layer and said third layer.

5. A semiconductor memory device according to claim 1, wherein said superlattice structure comprises a GaAs/AlGaAs heterostructure.

6. A semiconductor memory device according to claim 1, wherein said superlattice structure comprises a GaInAs/(AlGa)InAs heterostructure.

7. A semiconductor structure comprising:
a first power supply line;
a second power supply line;
device input and output terminals;
first and second transistor circuits, each comprising:
- a transistor having first, second and third semiconductor layers and first, second and third electrodes respectively coupled to said first, second and third layers, and a superlattice structure between said second and third layers, said superlattice structure including first and second barrier layers and at least one quantum well layer having a sub-band therein and provided between said first and second barrier layers, said first electrode being operatively connected to said first power supply line, said second electrode being operatively connected to said second power supply line, and said third electrode defining a transistor input terminal, said transistor exhibiting a negative differential resistance characteristic with respect to the flow of current between said first layer and said second layer relatively to the voltage between said third layer and second layer, whereby when minority carriers are injected from said second layer to said third layer through said sub-band, the energy level of the bottom of the conduction band formed between said third layer and said first layer is lower than the energy level specified by said injected minority carriers, said transistor correspondingly having two different, stable operating states and being selectively operable to maintain a selected one of said two different, stable operating states, and
- a resistor connected between said second power supply line and said second electrode at corresponding connection portions, and
- a transistor output terminal connected to the connection portion between said second power supply line and said second electrode, said transistor circuit producing an output at said transistor output terminal corresponding to the selected, maintained stable operating state of said transistor; and
said first transistor input and output terminals being connected to said device input terminal and to said second transistor input terminal, respectively, and said second transistor output terminal being connected to said device output terminal, one of said first and second transistors comprising a semiconductor memory device and the other of said first and second transistors comprising a logic element and both said first and second transistors having the same negative differential resistance characteristic.

8. A semiconductor memory device comprising:
a first power supply line;
a second power supply line;
device input and output terminals;
a transistor having first, second and third semiconductor layers, first, second and third electrodes respectively coupled to said first, second and third layers, and a superlattice structure between said second and third layers, said superlattice structure including first and second barrier layers and at least one quantum well layer having a sub-band therein and provided between said first and second barrier layers, said first electrode being operatively connected to said first power supply line, said second electrode being operatively connected to said second power supply line, and said third electrode being operatively connected to said input terminal, said transistor exhibiting a negative differential resistance characteristic with respect to the flow of current between said first layer and said second layer relatively to the voltage between said third layer and said second layer, whereby when minority carriers are injected from said second layer to said third layer through said sub-band, the energy level of the bottom of the conduction band formed between said third layer and said first layer is lower than the energy level specified by said injected minority carriers and said transistor correspondingly having two different operating states and being selectively operable to maintain a selected one of said two different operating states;
a first resistor connected between said second power supply line and said second electrode at corresponding connection portions;
a second resistor connected between said second power supply line and said second electrode at corresponding connection portions;
a first output terminal connected to the connection portion between said second power supply line and said second electrode, said device producing an output at said output terminal corresponding to the selected, maintained stable operating state of said transistor; and
a second output terminal connected to the connection portion between said second power supply line and said second electrode, said device producing an output at said output terminal corresponding to the selected, maintained stable operating state of said transistor, and the output level of said second output terminal being opposite to that of said first output terminal.

9. A semiconductor memory device according to claim 8, wherein said transistor further comprises:
a third barrier layer provided between said third layer and said first layer;
said second layer, said third layer, and said first layer are formed of the same conduction type semiconductor material; and
the energy level of the bottom of said third barrier is lower than the energy level specified by said injected minority carriers.

10. A semiconductor memory device according to claim 9, wherein said first layer, said second layer and said third layer are made of GaAs; and said third barrier layer is made of non-doped impurity $Al_y Ga_{y-1} As$.

11. A semiconductor memory device according to claim 9, wherein said first layer and said second layer are formed of the same first conduction type semiconductor material, said third layer is formed of a semiconductor material of a second conduction type, opposite to said first conduction type, and a PN-junction is formed at the interface of said first layer and said third layer.

12. A semiconductor memory device according to claim 8, wherein said superlattice structure comprises GaAs/AlGaAs heterostructure.

13. A semiconductor memory device according to claim 8, wherein said superlattice structure comprises GaInAs/(AlGa)InAs heterostructure.

14. A semiconductor memory and logic device comprising:
- a first power supply line;
- a second power supply line;
- device input and output terminals;
- first and second transistor circuits each comprising:
  - a transistor having first, second and third semiconductor layers, first, second and third electrodes respectively coupled to said first, second and third layers, and a superlattice structure between said second and third layers, said superlattice structure including first and second barrier layers and at least one quantum well layer having a sub-band therein and provided between said first and second barrier layers, said first electrode being operatively connected to said first power supply line, said second electrode being operatively connected to said second power supply line, and said third electrode being operatively connected to said input terminal, said transistor exhibiting a negative differential resistance characteristic with respect to the flow of current between said first layer and said second layer relatively to the voltage between said third layer and said second layer, whereby when minority carriers are injected from said second layer to said third layer through said sub-band, the energy level of the bottom of the conduction band formed between said third layer and said first layer is lower than the energy level specified by said injected minority carriers and said transistor correspondingly having two different operating states and being selectively operable to maintain a selected one of said two different operating states,
  - a first resistor connected between said second power supply line and said second electrode at corresponding connection portions,
  - a second resistor connected between said second power supply line and said second electrode at corresponding connection portions,
  - a first transistor output terminal connected to the connection portion between said second power supply line and said second electrode, said transistor circuit producing an output at said transistor output terminal corresponding to the selected, maintained stable operating state of said transistor, and
  - a second transistor output terminal connected to the connection portion between said second power supply line and said second electrode, said transistor circuit producing an output at said transistor output terminal corresponding to the selected, maintained stable operating state of said transistor, and the output level of said second transistor output terminal being opposite to that of said first transistor output terminal; and
- means for connecting selected ones of said first and second transistor input and output terminals and said device input and output terminals to form an operable circuit, one of said first and second transistors comprising a semiconductor memory device and the other thereof comprising a logic element.

15. A semiconductor memory device according to claim 14, further comprising:
- a plurality of said first transistors interconnected as corresponding pairs, each said pair defining a respective D-type flip-flop semiconductor memory device; and
- at least one said second transistor comprising an exclusive NOR logic element, connected with said plural D-type flip-flop semiconductor memory devices to form a random number generator.

* * * * *

UNITED STATES PATENT AND TRADEMARK OFFICE
CERTIFICATE OF CORRECTION

PATENT NO. : 5,023,836

DATED : June 11, 1991

INVENTOR(S) : MORI

It is certified that error appears in the above-identified patent and that said Letters Patent is hereby corrected as shown below:

Col. 1,    line 40, delete ",".

Col. 6,    line 29, after "volts" insert --;--;
                  line 55, after "3a" insert --,--.

*  Col. 7,    line 17, change "are" to --is--;
                  line 68, change "IFG." to --FIG.--.

Col. 8,    line 67, after "respective" insert --,--.

Col. 10,   line 28, after "$V_H$" insert --or--;
                  line 32, after "$V_{IN}$" delete --in--.

*  Col. 11,   line 6, change "13" to --13b--;
*                line 29, change "suficiently" to --sufficiently--;
                  line 50, after "current or" insert --of--.

Col. 12,   line 7, after "$FF_3$," insert --...,--;

Col. 13,   line 19, after "in" insert --the--.

Col. 15,   line 27, after "and" insert --said--.

UNITED STATES PATENT AND TRADEMARK OFFICE
CERTIFICATE OF CORRECTION

PATENT NO. : 5,023,836

DATED : June 11, 1991

INVENTOR(S) : MORI

It is certified that error appears in the above-identified patent and that said Letters Patent is hereby corrected as shown below:

* Col. 16, line 67, after "comprises" insert --a--.

Signed and Sealed this

Twentieth Day of July, 1993

*Attest:*

MICHAEL K. KIRK

*Attesting Officer*     *Acting Commissioner of Patents and Trademarks*